(12) United States Patent
Shin

(10) Patent No.: US 6,937,074 B2
(45) Date of Patent: Aug. 30, 2005

(54) POWER-UP SIGNAL GENERATOR IN SEMICONDUCTOR DEVICE

(75) Inventor: Yoon-Cherl Shin, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 217 days.

(21) Appl. No.: 10/334,294

(22) Filed: Dec. 31, 2002

(65) Prior Publication Data

US 2003/0214329 A1 Nov. 20, 2003

(30) Foreign Application Priority Data

May 20, 2002 (KR) .................................. 10-2002-27785

(51) Int. Cl.[7] ................................................ H03L 7/00
(52) U.S. Cl. ...................................................... 327/143
(58) Field of Search ................................. 327/143, 198

(56) References Cited

U.S. PATENT DOCUMENTS

| | | | |
|---|---|---|---|
| 5,159,206 A | 10/1992 | Tsay et al. | 327/143 |
| 5,337,284 A | 8/1994 | Cordoba et al. | 365/227 |
| 5,767,710 A | 6/1998 | Cho | 327/143 |
| 5,831,460 A * | 11/1998 | Zhou | 327/143 |
| 5,864,274 A * | 1/1999 | Steingroever et al. | 335/234 |
| 6,115,307 A | 9/2000 | Casper | 365/202 |
| 6,160,431 A * | 12/2000 | Crotty | 327/143 |
| 6,768,354 B2 * | 7/2004 | Yamazaki et al. | 327/143 |
| 2001/0022746 A1 | 9/2001 | Kim et al. | 365/200 |

FOREIGN PATENT DOCUMENTS

| | | |
|---|---|---|
| JP | 03-160687 | 7/1991 |
| JP | 04-209074 | 7/1992 |
| JP | 09-213091 | 8/1997 |

* cited by examiner

Primary Examiner—Quan Tra
(74) Attorney, Agent, or Firm—Marshall, Gerstein & Borun LLP

(57) ABSTRACT

A power-up signal generation circuit includes a first power-up detecting unit, to which an external power supply voltage is applied, for activating a first power-up signal when an increase of the external power supply voltage is detected, a second power-up detecting unit, to which an internal power supply voltage is applied, for activating a second power-up signal when an increase of the internal power supply voltage is detected and a power-up signal generating unit for activating a final power-up signal in response to combination of the first and the second power-up signals.

7 Claims, 5 Drawing Sheets

POWER-UP SIGNAL GENERATOR IN SEMICONDUCTOR DEVICE

BACKGROUND

1. Technical Field

A power-up signal generation circuit to be applied to various kinds of semiconductor devices is disclosed.

2. Description of the Related Art

FIG. 1 is a circuit diagram illustrating a conventional power-up signal generation circuit. The power-up signal generation circuit includes a plurality of PMOS transistors P11, P12, P13, and PCAP11, a plurality of NMOS transistors N11, NCAP1 and NCAP12 and a plurality of inverters INV11, INV12, INV13 and INV14.

The PMOS transistors P11 and P12 and the NMOS transistor N11 are coupled in series between a power supply voltage VDD and a ground voltage. The gate of the first PMOS transistor P11 is coupled to the drain thereof, and the gate of the second PMOS transistor P12 is coupled to the ground voltage. The gate of the first NMOS transistor N11 is coupled to the drain thereof, and the gate of the second NMOS transistor NCAP11, whose drain and source are coupled to each other and to the ground voltage, is coupled to the drain of the second PMOS transistor P12. The third PMOS transistor P13 is coupled between the power supply voltage VDD and a first node node11, that is connected to the drain of the second PMOS transistor P12. An input of the first inverter INV11 is coupled to the first node node11 and the output of the first inverter INV11 is coupled to the gate of the third PMOS transistor P13 and a second node node12. The drain and the source of the fourth PMOS transistor PCAP11, whose gate is coupled to the second node node12, are coupled to each other and to the power supply voltage VDD. An input of the second inverter INV12 is coupled to the second node node12. The drain and the source of the third NMOS transistor NCAP12, whose gate is coupled to a third node node13 that is connected to an output of the second inverter INV12, are coupled to each other and to the ground voltage. The third and fourth inverters INV13 and INV14 are coupled in series. An input of the third inverter INV13 is coupled to the third node node13. The fourth inverter INV14 receives an output signal from the third inverter INV13 and outputs a power-up signal PWRUP.

Hereinafter, an operation of the conventional power-up detection circuit will be described as follow:

If the power supply voltage VDD applied from an external circuit is increased, the voltage level of the first node node11 is increased from VSS to a predetermined voltage level according to a current ratio of the first PMOS transistor P11, the second PMOS transistor P12 and the first NMOS transistor N11. If the voltage level at the first node node11 is increased above a threshold voltage of the first inverter INV11, the voltage level at the second node node12 is initially increased as much as the increased power supply voltage VDD since the second node node12 is coupled to the gate of the fourth PMOS transistor PCAP11. The voltage level at the second node node12 is then reduced to the ground voltage VSS by the first inverter INV11. The power-up signal PWRUP1 is transitioned from a low level to a high level by passing through the inverters INV12, INV13 and INV14. Particularly, the external power supply voltage VDD applied to the circuit is detected and then the power-up signal PWRUP1, which represents that the operation voltage has been completely applied, is outputted.

The power supply voltage VDD is detected by using one or more capacitor elements NCAP or PCAP. According to the conventional power-up detecting circuit described above, if the external power supply voltage VDD is applied to the circuit and the applied external power voltage ramps up to its voltage level too slowly, there may be a problem that the power-up signal PWRUP1 is not appropriately generated since the detection operation of the capacitor element may fail during a slow voltage ramp-up. Recently, since there has been a tendency for the voltage level of the external power supply voltage VDD to be decreased, the above problem may be more serious.

SUMMARY OF THE DISCLOSURE

A power-up signal generation circuit capable of stably generating a power-up signal in a slow power-up operation is disclosed.

An apparatus for generating a power-up signal includes: a first power-up detecting unit to which an external power supply voltage is applied, wherein the first power-up detecting unit is configured to activate a first power-up signal when an increase of the external power supply voltage is detected; a second power-up detecting unit to which an internal power supply voltage is applied, wherein the second power-up detecting unit is configured to activate a second power-up signal when an increase of the internal power supply voltage is detected; and a power-up signal generating means for activating a final power-up signal in response to a combination of the first and the second power-up signals.

DETAILED DESCRIPTION

Hereinafter, a power-up signal generating circuit generates a power-up signal to indicate the start of operation of a semiconductor device by detecting an external power supply voltage VDD in the semiconductor device will be described in detail referring to the accompanying drawings.

Figure 2:
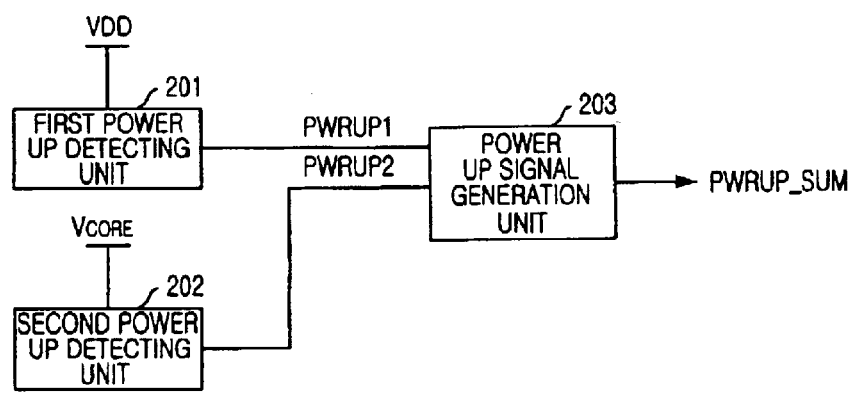
FIG. 2 is a block diagram illustrating a power-up signal generation circuit in accordance with a first embodiment.

FIG. 2 is a block diagram illustrating a power-up signal generation circuit in accordance with a first embodiment. The power-up signal generation circuit includes a first power-up detecting unit 201, a second power-up detecting unit 202 and a first power-up signal generation unit 203.

Figure 1:
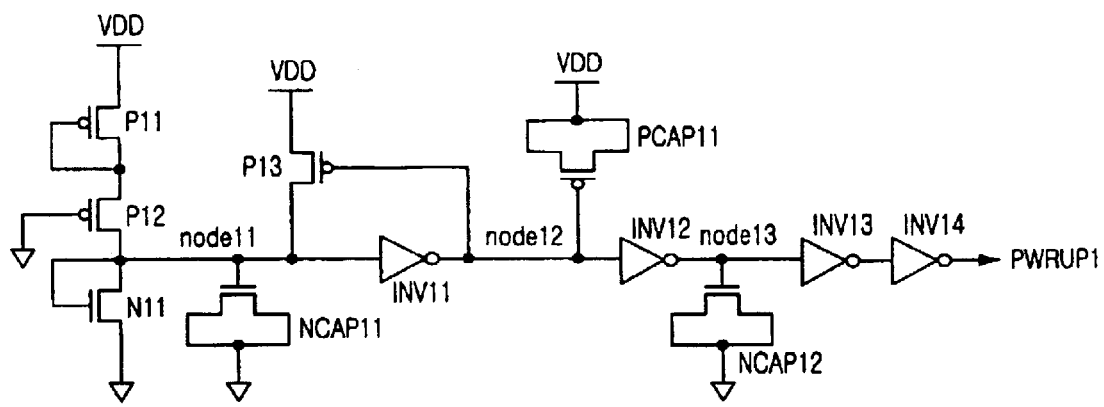
FIG. 1 is a circuit diagram illustrating a conventional power-up signal generation circuit.

When the first power-up detecting unit 201, to which an external power supply voltage VDD is applied, detects an increase of the power supply voltage VDD, the first power-up detecting unit 201 generates a first power-up signal PWRUP1. The first power-up signal PWRUP1 is inputted to the first power-up signal generation unit 203. The first power-up detecting unit 201 may be configured identical to the conventional power-up signal generation circuit illustrated in FIG. 1.

When the second power-up detecting unit 202, to which an internal power supply voltage $V_{CORE}$ is applied, detects an increase of the internal power supply voltage $V_{CORE}$, the second power-up detecting unit 202 generates a second power-up signal PWRUP2. The second power-up signal PWRUP2 is inputted to the first power-up signal generation unit 203. The internal power supply voltage $V_{CORE}$ represents an internal power supply voltage supplied to a cell array. Also, an internal power supply voltage $V_{peri}$ that is supplied to a peripheral area may be employed.

The first power-up signal generation unit 203 receives the first power-up signal PWRUP1 outputted from the first power-up detecting unit 201 and the second power-up signal PWRUP2 outputted from the second power-up detecting unit 202 and generates a final power-up signal PWRUP_SUM.

Figure 3:
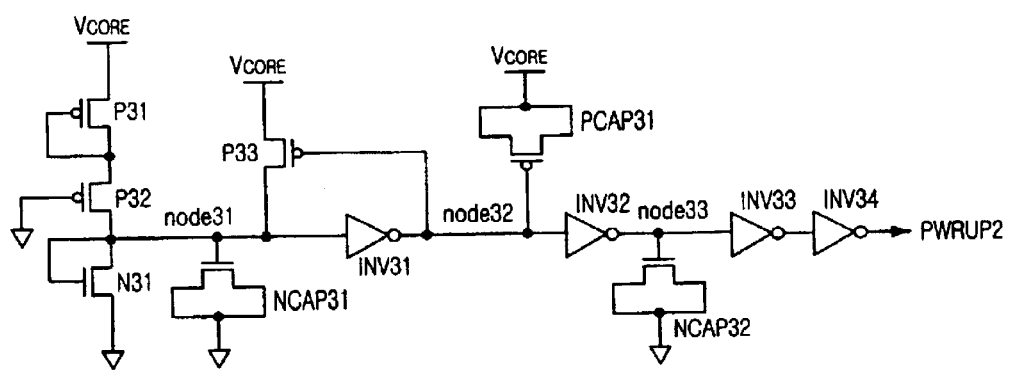
FIG. 3 is an exemplary circuit diagram of the second power-up detecting unit illustrated in FIG. 2.

FIG. 3 is an exemplary circuit diagram illustrating the second power-up detecting unit 202 of the power-up signal generation circuit in accordance with the first embodiment.

The second power-up detecting unit 202 includes a plurality of PMOS transistors P31, P32, P33 and PCAP31, a plurality of NMOS transistors N31, NCAP31 and NCAP32 and a plurality of inverters INV31, INV32, INV33 and INV34.

The transistors P31, P32 and N31 are coupled in series between the internal power supply voltage $V_{CORE}$ and a ground voltage. The gate of the PMOS transistor P31 is coupled to the drain thereof, and the gate of the PMOS transistor P32 is coupled to the ground voltage. Also, the gate of the NMOS transistor N31 is coupled to the drain thereof.

The inverters INV31, INV32, INV33 and INV34 are coupled in series. An input of the inverter INV31 is coupled to a node node31, which is connected to a junction of the transistors P32 and N31. The gate of the NMOS transistor NCAP31, whose drain and source are coupled to each other and to the ground voltage, is coupled to the node node31. Herein, the NMOS transistor NCAP31 operates as a capacitor. The PMOS transistor P33, whose gate is coupled to an output of the inverter INV31, is coupled between the internal voltage $V_{CORE}$ and the node node31. The gate of the PMOS transistor PCAP31, whose drain and source are coupled to each other and to the internal voltage $V_{CORE}$, is coupled to a node node32, which connects the inverter INV31 with the inverter INV32. Herein, the PMOS transistor PCAP31 operates as a capacitor. The gate of the NMOS transistor NCAP32, whose drain and source are coupled to each other and to the ground voltage, is coupled to a node node33, which connects the inverter INV32 with the inverter INV33. Herein, the NMOS transistor NCAP32 operates as a capacitor. The inverter INV34 outputs the second power-up signal PWRUP2.

Figure 4:
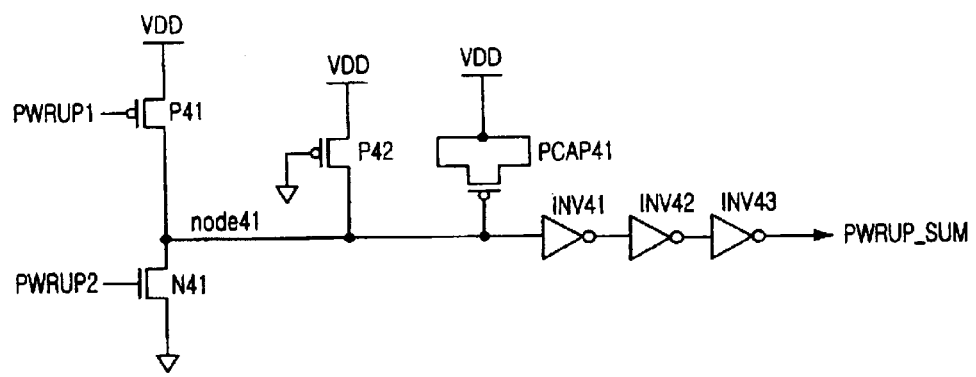
FIG. 4 is an exemplary circuit diagram of the first power-up signal generation unit illustrated in FIG. 2.

FIG. 4 is an exemplary circuit diagram illustrating the first power-up signal generation unit 203 of the power-up signal generation circuit in accordance with the first embodiment.

As shown, the source of a PMOS transistor P41 is coupled to VDD and the first power-up signal PWRUP1 outputted from the first power-up detection unit 201 is applied to the gate of the fifth PMOS transistor P41. The source of the fourth NMOS transistor N41 is coupled to VSS and its drain is coupled to the drain of the fifth PMOS transistor P41. The second power-up signal PWRUP2 outputted from the second power-up detecting unit 202 is applied to the gate of the fourth NMOS transistor N41.

The source of a sixth PMOS transistor P42 is coupled to VDD, its gate is coupled to VSS and its drain is coupled to the drain of the fifth PMOS transistor P41. The sixth PMOS transistor P42, which is coupled to VSS at its source, is always turned on and is coupled to a fourth node node41 at its drain. The sixth PMOS transistor P42 provides a DC path between the fourth node node41 and VDD. Particularly, an initial voltage level of the fourth node node41 is maintained at VDD. The sixth PMOS transistor P42 is configured with a long channel transistor due to current consumption.

The drain and the source of a seventh PMOS transistor PCAP41 are coupled to each other and to VDD. The gate of the seventh PMOS transistor PCAP41 is coupled to the drain of the fifth transistor P41. A fifth inverter INV41 inverts a signal received through the drain of the fifth PMOS transistor P41 and outputs an inverted signal. A sixth inverter INV42 inverts a signal received at the output of the fifth inverter INV41 and outputs an inverted signal. A seventh inverter INV43 inverts a signal received at an output of the sixth inverter INV42 and outputs an inverted signal.

Figure 5:
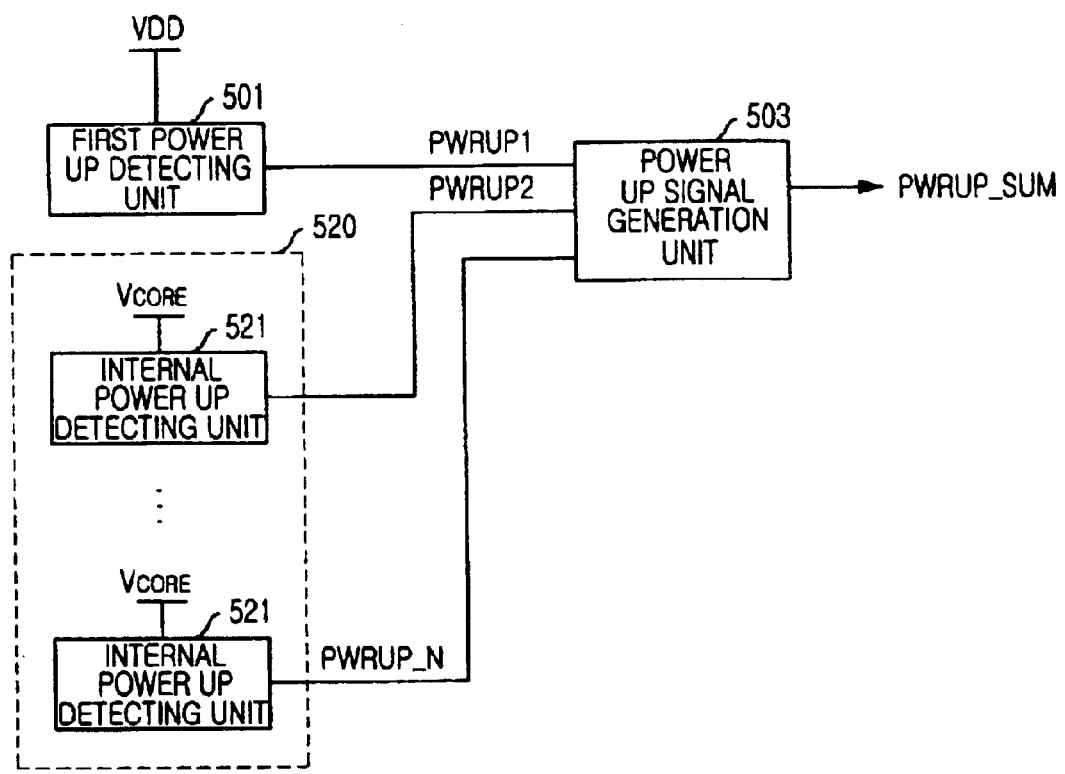
FIG. 5 is a block diagram illustrating a power-up signal generation circuit in accordance with a second embodiment.

FIG. 5 is a block diagram illustrating a power-up signal generation circuit in accordance with a second embodiment. The power-up signal generation circuit according to the second embodiment includes a first power-up detecting unit 501, a third power-up detecting unit 520 and a second power-up signal generation unit 503.

An external power supply voltage VDD is applied to the first power-up detecting unit 501 and, when the first power-up detecting unit 501 detects an increase of the external power supply voltage, the first power-up detecting unit 501 generates a first power-up signal PWRUP1, which is inputted to the second power-up signal generation unit 503. The first power-up detecting unit 501 may be configured identical to the conventional power-up detecting circuit illustrated in FIG. 1.

The third power-up detecting unit 520 includes a plurality of internal power-up detecting units 521. An internal power supply voltage $V_{CORE}$ is applied to each of the plurality of internal power-up detecting units 521 and, when an increase of the internal power supply voltage $V_{CORE}$ is detected, a plurality of internal power-up signals PWRUP_2 to PWRUP_N are respectively generated. The plurality of internal power-up signals PWRUP_2 to PWRUP-N are inputted to the second power-up signal generation unit 503. Each of the plurality of internal power-up detecting units 521 may be configured identical to the second power-up detecting unit 202 illustrated in FIG. 3, so that, for the sake of convenience, the explanation of the plurality of internal power-up detecting units 521 will be omitted.

The second power-up signal generating generation unit 503 receives the first power-up signal from the first power-up detecting unit 501 and the plurality of internal power-up signals from the third power-up detecting unit 520. The second power-up signal generation unit 503 generates and outputs a final power-up signal PWRUP_SUM in response to the first power-up signal and the plurality of internal power-up signals.

Figure 6:
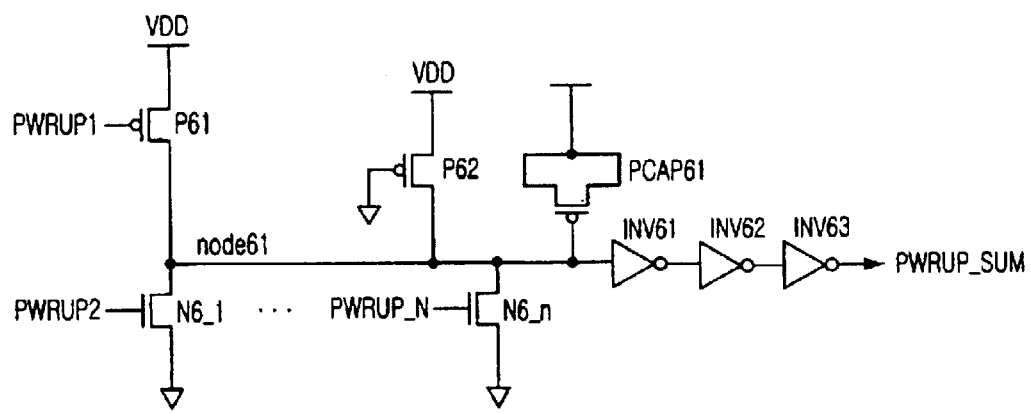
FIG. 6 is an exemplary circuit diagram of the second power-up signal generation unit illustrated in FIG. 5.
Figure 7:
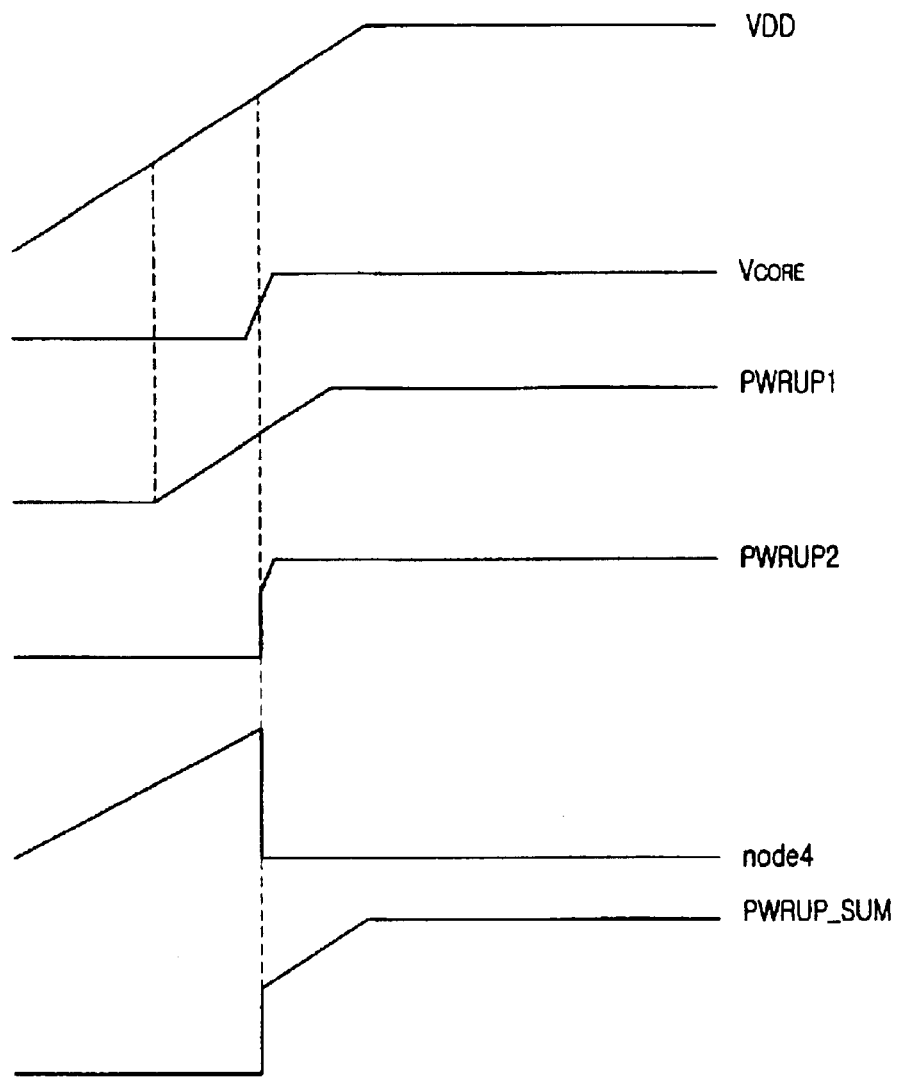
FIG. 7 is a timing diagram showing the operation of the power-up signal generation circuit in accordance with the present disclosure.

FIG. 6 is an exemplary circuit diagram illustrating the second power-up signal generation unit 503 of the power-up signal generation circuit in accordance with the second embodiment.

The source of an eighth PMOS transistor P61 is coupled to VDD and the first power-up signal PWRUP1 from the first power-up detecting unit 201 is applied to the gate thereof. The sources of the plurality of NMOS transistor N6_1 to N6_N are coupled to VSS, their drains are all coupled to the drain of the eighth PMOS transistor P61, and the plurality of power-up signals are applied to gates thereof.

The source of a ninth PMOS transistor P62 is coupled to VDD, its gate is coupled to VSS, and its drain is coupled to the drain of the eighth PMOS transistor P61. The ninth PMOS transistor P62, whose gate is coupled to VSS, is always turned on and coupled to a fifth node node61 at its drain. Particularly, the ninth PMOS transistor P62 provides a DC path between the fifth node node61 and VDD, so that an initial voltage level of the fifth node node61 is maintained at VDD. The ninth PMOS transistor P62 is configured with a long channel transistor due to current consumption.

The drain and the source of a tenth PMOS transistor PCAP61 are coupled to each other and to VDD, and its gate is coupled to the drain of the eighth PMOS transistor P61. An eighth inverter INV61 inverts a signal received through the drain of the eighth PMOS transistor P61 and outputs an inverted signal. Also, a ninth inverter INV62 inverts a signal received at an output of the eighth inverter INV61 and outputs an inverted signal. A tenth inverter INV63 inverts an output signal of the ninth inverter INV62 and outputs an inverted signal.

The first power-up signal generation unit 203 and the second power-up signal generation unit 503 receive the first power-up signal outputted from the first power-up detecting unit 201 or 501 along with the second power-up signal outputted from the second power-up detecting unit 202 or the plurality of internal power-up signals outputted from the third power-up detecting unit 520, and output the final power-up signal PWRUP_SUMP in a high level, which represents that the power supply voltage has been properly applied to the device. Even if the first power-up signal is not generated due to capacitor coupling, the final power-up signal is still outputted in a high level in response to the second power-up signal or the plurality of internal power-up signals.

If the first power-up signal PWRUP1 inputted to the first power-up signal generation unit 203 is in a logic high level, the voltage level of the fourth node node41 is transitioned to a logic low level and the final power-up signal PWRUP_SUM is generated and outputted by the first power-up signal generation unit 203.

If the first power-up signal PWRUP1 inputted to the first power-up signal generation unit 203 is in a logic low level, generation of the final power-up signal PWRUP_SUM is determined according to the logic level of the second power-up signal PWRUP2. If the second power-up signal PWRUP2 is at a logic high level, the final power-up signal is generated and outputted by the first power-up signal generation unit 203. On the other hand, if the second power-up signal PWRUP2 is at a logic low level, the final power-up signal is not activated by the first power-up signal generation unit 203.

Since the external supply voltage VDD and the internal power supply voltage $V_{CORE}$ are employed, error in the operation of the power-up signal generation circuit can be prevented. Particularly, even if the external power supply voltage level VDD is slowly ramped up to a predetermined voltage level, the final power-up signal can still be properly generated.

While the disclosed circuits and devices have been described with respect to the particular embodiments, it will be apparent to those skilled in the art that various changes and modifications may be made without departing from the spirit and scope of this disclosure as defined in the following claims.

What is claimed is:

1. An apparatus for generating a power-up signal, comprising:

a first power-up detecting circuit to which an external power supply voltage is applied, the first power-up detecting circuit configured to activate a first power-up signal when an increase of the external power supply voltage is detected;

a second power-up detecting circuit to which an internal power supply voltage is applied, the second power-up detecting circuit configured to activate a second power-up signal when an increase of the internal power supply voltage is detected; and a power-up signal generating circuit configured to activate a final power-up signal in response to a combination of the first and second power-up signals, wherein the power-up signal generating circuit comprises:

a first p-type metal oxide semiconductor (PMOS) transistor, a source of the first PMOS transistor being coupled to the external power supply voltage, and the first power-up signal being applied to a gate of the first PMOS transistor;

a first n-type metal oxide semiconductor (NMOS) transistor, a source of the first NMOS transistor being coupled to a ground voltage, a drain of the first NMOS transistor being coupled to a drain of the first PMOS transistor, and the second power-up signal being applied to a gate of the first NMOS transistor;

a second PMOS transistor, a source of the second PMOS transistor being coupled to the external power supply voltage, a gate of the second PMOS transistor being coupled to the around voltage, and a drain of the second PMOS transistor being coupled to the drain of the first PMOS transistor;

a third PMOS transistor, a drain of the third PMOS transistor and a source of the third PMOS transistor being coupled to the external power supply voltage, and a gate of the third PMOS transistor being coupled to the drain of the first PMOS transistor;

a first inverter configured to invert a signal from the drain of the first PMOS transistor;

a second inverter configured to invert a signal from the first inverter; and a third inverter configured to invert a signal from the second inverter.

2. The apparatus as recited in claim 1, wherein the second power-up detecting circuit comprises:

a fourth PMOS transistor, a source of the fourth PMOS transistor being coupled to the internal power supply voltage, and a gate of the fourth PMOS transistor being coupled to a drain of the fourth PMOS transistor;

a fifth PMOS transistor, a source of the fifth PMOS transistor being coupled to the drain of the fourth PMOS transistor, and a gate of the fifth PMOS transistor being coupled to the ground voltage;

a second NMOS transistor, a drain of the second NMOS transistor being coupled to a drain of the fifth PMOS transistor, a gate of the second NMOS transistor being coupled to the drain of the second NMOS transistor, and a source of the second NMOS transistor being coupled to the ground voltage;

a third NMOS transistor, a drain of the third NMOS transistor and a source of the third NMOS transistor being coupled to the ground voltage, and a gate of the third NMOS transistor being coupled to the drain of the fifth PMOS transistor;

a sixth PMOS transistor, a source of the sixth PMOS transistor being coupled to the internal power supply voltage, and a drain of the sixth PMOS transistor being coupled to the drain of the fifth PMOS transistor;

a fourth inverter configured to invert a signal received through the drain of the fifth PMOS transistor and output an inverted signal to a gate of the sixth PMOS transistor;

a seventh PMOS transistor, a drain of the seventh PMOS transistor and a source of the seventh PMOS transistor being coupled to the internal power supply voltage, and a gate of the seventh PMOS transistor being coupled to the gate of the sixth PMOS transistor;

a fifth inverter configured to invert a signal from the gate of the seventh PMOS transistor;

a fourth NMOS transistor, a drain of the fourth NMOS transistor and a source of the fourth NMOS transistor being coupled to the ground voltage, and a gate of the fourth NMOS transistor being coupled to an output of the fifth inverter;

a sixth inverter configured to invert a signal from the fifth inverter; and a seventh inverter configured to invert a signal from the sixth inverter.

3. The apparatus as recited in claim 1, wherein the second PMOS transistor is a long channel transistor.

4. An apparatus for generating a power-up signal, comprising:

a first power-up detecting circuit, an external power supply voltage being applied to the first power-up detecting circuit, and the first power-up detecting circuit configured to activate a first power-up signal when an increase of the external power supply voltage is detected;

a second power-up detecting circuit having a plurality of internal power-up detecting circuits, an internal power supply voltage being applied to each of the plurality of internal power-up detecting circuits, and the second power-up detecting circuit being configured to activate a plurality of power-up signals when an increase of the internal power supply voltage is detected; and a power-up signal generating circuit configured to receive the first power-up signal and the plurality of power-up signals, and activate a final power-up signal.

5. The apparatus as recited in claim 4, wherein each of the plurality of internal power-up detecting circuits comprises:

a first p-type metal oxide semiconductor (PMOS) transistor, a source of the first PMOS transistor being coupled to the internal power supply voltage, and a gate of the first PMOS transistor being coupled to a drain of the first PMOS transistor;

a second PMOS transistor, a source of the second PMOS transistor being coupled to the drain of the first PMOS transistor, and a gate of the second PMOS transistor being coupled to a ground voltage;

a first n-type metal oxide semiconductor (NMOS) transistor, a drain of the first NMOS transistor being coupled to a drain of the second PMOS transistor, a gate of the first NMOS transistor being coupled to the drain of the first NMOS transistor, and a source of the first NMOS transistor being coupled to the ground voltage;

a second NMOS transistor, a drain of the second NMOS transistor and a source of the second NMOS transistor being coupled to the ground voltage, and a gate of the second NMOS transistor being coupled to the drain of the second PMOS transistor;

a third PMOS transistor, a source of the third PMOS transistor being coupled to the internal power supply voltage, and a drain of the third PMOS transistor being coupled to the drain of the second PMOS transistor;

a first inverter configured to invert a signal received through the drain of the second PMOS transistor and output an inverted signal to a gate of the third PMOS transistor;

a fourth PMOS transistor, a drain of the fourth PMOS transistor and a source of the fourth PMOS transistor being coupled to the internal power supply voltage, and a gate of the fourth PMOS transistor being coupled to the gate of the third PMOS transistor;

a second inverter configured to invert a signal from the gate of the fourth PMOS transistor;

a third NMOS transistor, a drain of the third NMOS transistor and a source of the third NMOS transistor being coupled to the ground voltage, and a gate of the third NMOS transistor being coupled to an output of the second inverter;

a third inverter configured to invert a signal from the second inverter; and a fourth inverter configured to invert a signal from the third inverter.

6. The apparatus as recited in claim 4, wherein the power-up signal generating circuit comprises:

a fifth PMOS transistor, a source of the fifth PMOS transistor being coupled to the external power supply voltage, the first power-up signal being applied to a gate of the fifth PMOS transistor;

a plurality of fourth NMOS transistors, a source of each of the plurality of fourth NMOS transistors being coupled to the ground voltage, and a drain of each of the plurality of fourth NMOS transistors being coupled to a drain of the fifth PMOS transistor, wherein the plurality of power-up signals is applied to a gate of each of the plurality of fourth NMOS transistors;

a sixth PMOS transistor, a source of the sixth PMOS transistor being coupled to the external power supply voltage, a gate of the sixth PMOS transistor being coupled to the ground voltage, and a drain of the sixth PMOS transistor being coupled to the drain of the fifth PMOS transistor;

a seventh PMOS transistor, a drain of the seventh PMOS transistor and a source of the seventh PMOS transistor being coupled to the external power supply voltage, and a gate of the seventh PMOS transistor being coupled to the drain of the fifth PMOS transistor;

a fifth inverter configured to invert a signal inputted from the drain of the fifth PMOS transistor;

a sixth inverter configured to invert a signal inputted from the fifth inverter; and a seventh inverter configured to invert a signal inputted from the sixth inverter.

7. The apparatus as recited in claim 6, wherein the sixth PMOS transistor is a long channel transistor.

* * * * *